United States Patent [19]

Price et al.

[11] Patent Number: 5,259,006
[45] Date of Patent: Nov. 2, 1993

[54] METHOD FOR SUBSTANTIALLY ELIMINATING HOLD TIME VIOLATIONS IN IMPLEMENTING HIGH SPEED LOGIC CIRCUITS OR THE LIKE

[75] Inventors: Roderick A. Price, Palo Alto; Bart C. Thielges, San Jose, both of Calif.

[73] Assignee: Quickturn Systems, Incorporated, Mountain View, Calif.

[21] Appl. No.: 747,740

[22] Filed: Aug. 20, 1991

Related U.S. Application Data

[63] Continuation of Ser. No. 510,698, Apr. 18, 1990, abandoned.

[51] Int. Cl.⁵ ............................................. H04L 7/06
[52] U.S. Cl. ..................................... 375/107; 375/106; 377/80; 307/269; 371/1
[58] Field of Search ............... 375/106, 107, 118, 111; 377/78, 80; 307/269; 371/1

[56] References Cited

U.S. PATENT DOCUMENTS

| | | | |
|---|---|---|---|
| 4,426,713 | 1/1984 | Shimizu et al. | 375/106 |
| 4,698,826 | 10/1987 | Denhey et al. | 375/107 |
| 4,755,704 | 7/1988 | Flora et al. | 375/107 |
| 4,811,364 | 3/1989 | Sager et al. | 375/111 |
| 4,949,361 | 8/1990 | Jackson | 375/118 |

*Primary Examiner*—Curtis Kuntz
*Assistant Examiner*—Young Tse
*Attorney, Agent, or Firm*—Kenneth D'Alessandro

[57] ABSTRACT

A method is provided for eliminating hold time violations in implementing high-speed logic circuits specified in circuit configuration data includes the steps of providing a synchronizer flip-flop device or latch corresponding to every flip-flop device or latch specified in the circuit configuration data. The synchronizer flip-flop is provided immediately upstream in the data path from its corresponding original user flip-flop device. A predetermined amount of delay is added to the user's original clock and data signals. A synchronizing clock signal generator provides a delayed synchronizer clock for each master clock in the circuit which is provided to each user flip flop.

8 Claims, 5 Drawing Sheets

METHOD FOR SUBSTANTIALLY ELIMINATING HOLD TIME VIOLATIONS IN IMPLEMENTING HIGH SPEED LOGIC CIRCUITS OR THE LIKE

RELATED APPLICATIONS

This application is a continuation of application Ser. No. 07/510,698, filed Apr. 18, 1990, now abandoned.

BACKGROUND OF THE INVENTION

Field of the Invention

The present invention relates to digital sequential logic circuits, and in particular to a method for automatically eliminating hold time violations in a system for implementing logic circuitry from a user net list or prototype configuration.

As electronic components and electronic systems grow more complex, the design of these components and systems has become a more time-consuming and demanding task. Recently, emulation of electronic components and systems has emerged as an important tool for designers. Simulation systems now include apparatus which aids in the development of integrated circuits and systems design by quickly and automatically generating a hardware prototype of an integrated circuit or system to be designed from a user's schematics or net list. Such an apparatus is described in U.S. patent application Ser. No. 279,477. In such systems, a prototype circuit is electrically reconfigurable and may be modified to represent an indefinite number of designs with no manual wiring changes or device replacement. The prototype circuit runs at real time or very closely approximates real time speed and may be incorporated into a larger system. Also, VLSI chips or ASIC devices may be plugged into a prototype circuit and run as part of the emulated design.

When designing such circuitry, it is important to implement the necessary logic functions and to connect them together into a complete and functioning design. Synchronization requires that data arrive at a logic device such as a flip-flop at an appropriate time relative to a clock pulse. There is a specified "setup time" and "hold time" for any clocked device. Setup time requires that input data must be present at the data input lead of a flip-flop device and in stable form for a predetermined amount of time before the clock transition. Hold time requires that the data be stable from the time of the clock transition on arrival at the control lead of a flip-flop up to a certain time interval after the arrival of the clock for proper operation. For example, the so called 7474 TTL positive edge triggered D type flip-flop has a setup time of 20 nanoseconds and a hold time of 5 nanoseconds. When implementing a circuit from user net list data containing thousands of flip-flop devices, any violation of the stringent hold time or setup time parameters would prevent proper operation of the implemented circuit. A key process in implementing a logic circuit from a user's net list is to synchronize the setup and hold time of data with the arrival of a corresponding clock. Data must be present and stable at the D input of a flip-flop for a specific space of time with respect to the arrival of the corresponding clock at the clock input to ensure the proper operation of the implemented logic circuit.

It will be appreciated that setup time violations may be remedied simply by slowing down the speed at which the design is clocked. Hold time violations, however, persist regardless of clock speed and depend only on the clock skew in various parts of the design.

Therefore, in implementing a circuit from user net list data, the proper timing of clock signals may be hindered due to excessive delay in the clock lines by reason of clock skew. This may cause data in a first logic device such as a flip-flop or shift register to shift earlier than data on a second register. The hold time requirement of the second register is violated and data bits may then be lost unless the shift registers are properly synchronized.

It is to be expected that in an implementation of a high-speed logic system from a user net list, thousands of logic devices such as flip-flops must be duplicated and synchronized with extreme precision. A problem that may arise in such an implementation is that skew on the clock lines may develop so that a flip-flop may actually receive data caused by a clock before it receives the clock signal itself. In that case, the flip-flop would not be able to clock in the intended data, as that data would have been overwritten by newer data.

It is apparent therefore that what is needed is a method for eliminating hold time violations even in the presence of massive clock skew in order to facilitate the implementation of a high-speed logic circuit from a user net list. Such a method for eliminating hold time violations would advantageously be implemented in an automatic manner. This would eliminate the need to manually synchronize the proper arrival of clocks and setup and hold time of data by trial and error techniques.

One prior art method for synchronizing a clock distribution system is described in the article, "CURRENT TECHNOLOGY AND DESIGN METHODOLOGY FOR SYSTEM DESIGNERS, J. Zasio, WESCON Conference Record, Nov. 14-15, 1989." This method suggests the use of level triggered latches and a two phase non-overlapping clock. As long as the two clock phases do not overlap, there will be no hold time violations. However, this prior art method has the disadvantage of doubling the number of clocks for the combinatorial logic to be emulated. Thus, it is apparent that what is needed is an automatic method for eliminating hold time violations which does not unduly increase the complexity of the prototype circuit.

SUMMARY OF THE INVENTION

In order to overcome the above discussed problem of synchronizing a clock distribution system and the arrival and propagation of data through flip-flop devices in implementing high-speed logic circuitry or the like from a user net list, the present invention provides a method for automatically eliminating hold time violations, even in the presence of clock skew. According to the method of the present invention, every original user flip-flop or latch in the user net list or prototype circuit has in the implemented circuit, a corresponding shadow flip-flop or latch added upstream in the data path of the original user flip-flop. The shadow or synchronizing flip-flop or latch is also referred to herein as a synchronizer. Each synchronizer flip-flop device has a data input lead for receiving data from the original user net list, a control lead for receiving a clock signal and an output lead which is connected to the data input lead of the corresponding original user flip-flop. In order to insure that the synchronizer will capture the user-netlist data at the appropriate time, the synchronizer is driven by a synchronizing clock. The synchronizing clock must always arrive at the synchronizer before the user's clock and before the new user's data. Accordingly, the user's original clock is delayed by a delay means such as a series of buffers, or in accordance with other well known techniques for introducing delay.

The amount of delay added to the user clock depends upon the amount of skew in the circuit being implemented. The amount of skew in the implemented circuit is determined from the user net list or prototype circuit configuration by timing analysis techniques well known to those of ordinary skill in the art. After the skew has been determined, just enough delay is added to the user clock such that a synchronizing clock always arrives at a synchronizer flip-flop before the user clock arrives at the user original flip-flop.

A typical design must accept inputs and deliver outputs to another larger or separate system. For example, an integrated circuit accepts inputs and delivers outputs to the printed circuit board on which it is attached. The synchronization method described in this application assures that data is stable at the inputs to the synchronizer flip-flops before the synchronizing clock arrives, as long as the data is coming from another synchronized flip-flop. If the data is coming from somewhere external to the synchronized design, a delay factor must be added to the data inputs to insure that the synchronizing clock arrives at the synchronizing flip-flop before the new data, assuming that the clock and data inputs to the design change at approximately the same time.

In accordance with the invention, a synchronizing clock generator generates a synchronizing clock which is applied to the clock input leads of the synchronizer flip-flops. All the synchronizing clocks which are on the same frame of reference, that is, which are derived from the same source, are gated together by an OR gate having multiple input leads. This produces a single synchronizing clock for each frame of reference in the user's original net list. The synchronizing clock generator in its simplest form gates together the user original clock and a delayed clock through an Exclusive OR gate. The output of the Exclusive OR gate provides a synchronizing clock signal which always arrives at the clock input of the synchronizer flip-flop before the data arrives on the D input of the synchronizer flip-flop. The operation of the synchronizing process may be viewed in two stages. In a first stage, the synchronizing clock is given enough time to be input into all the synchronizer flip-flops. This captures the complete state of the design of the user net list or prototype circuit in the synchronizers. In a subsequent stage, the user's master clocks are allowed to propagate, and thus to clock the proper data into the user's flip-flops.

In accordance with the invention, the derived synchronizing clock will arrive at a corresponding synchronizer before either the user's clock changes or the data on the data input pins of the synchronizer changes, even though it still may not be known in what order the user's clock on the clock input of the user's original flip-flops and the data on the data input lead of the synchronizer flip-flop may change. The arrival of the synchronization clock at the synchronizer will capture the old value of data which is present at the data input pins of the synchronizer and present that value as a stable value at the data input pins of the users flip-flop so that the user's clock can arrive at its leisure. In particular, a change to the data at the data input pin of the synchronizer cannot change what already has been captured in the synchronizer. The synchronizing clock has a rising edge for each edge of the user's master clock. Thus, it does not matter whether the original user's flip-flop was capturing data on the rising edge or on the falling edge of a clock. Because the synchronizing clock has a rising edge for each edge of the master clock, the synchronizer will clock in all the data captured for each edge of the master clock. That is, if the user flip-flop is triggered by the rising edge of the clock, the pulses in the synchronizing clock will capture data properly in the synchronizer. If the user original flip-flop was triggered by the falling edge of the clock, the synchronizing clock also captures that data and clocks it properly into the synchronizer. The extra edges do no harm to the synchronizing system according to the invention. That is, if the user clock only captures data on a rising edge, the pulse on the synchronizing clock corresponding to the rising edge will capture data. Other pulses of the synchronizing clock will also capture data but the attached user flip-flop will not be clocked so the extra synchronizing clocks will have no effect.

It will be appreciated that the synchronization method in accordance with the present invention works for multiple non-overlapping user clocks. All that is needed is that multiple clocks on the same frame of reference be put through an OR gate before being applied to the synchronizing flip-flop. If the user clocks overlap, a synchronizing clock is generated from each user clock independently. The individual synchronizing clocks are then gated together by an OR gate. Care must be taken that edges do not occur too close together as this would cause the synchronizing clocks to overlap.

In addition, it will be appreciated that it is necessary to add delay only to the user master clocks. All other user clocks on that same frame of reference will then automatically be delayed. The present invention is applicable to a user net list containing a plurality of master clocks operating on a plurality of frames of reference. All that is needed is that a single synchronizing clock be derived for each separate frame of reference in the user net list.

It will be appreciated that a transparent latch may be used in place of a flip-flop for the synchronizing element. If the device being synchronized in the user's original net list is a latch, a latch is preferred as the synchronizing element in order to maintain the transparency characteristic of the user's original device.

BRIEF DESCRIPTION OF THE DRAWINGS

These and other advantages of the present invention may be appreciated from studying the following detailed description of the presently preferred exemplary embodiment together with the drawings.

DETAILED DESCRIPTION OF A PREFERRED EMBODIMENT

Figure 1:
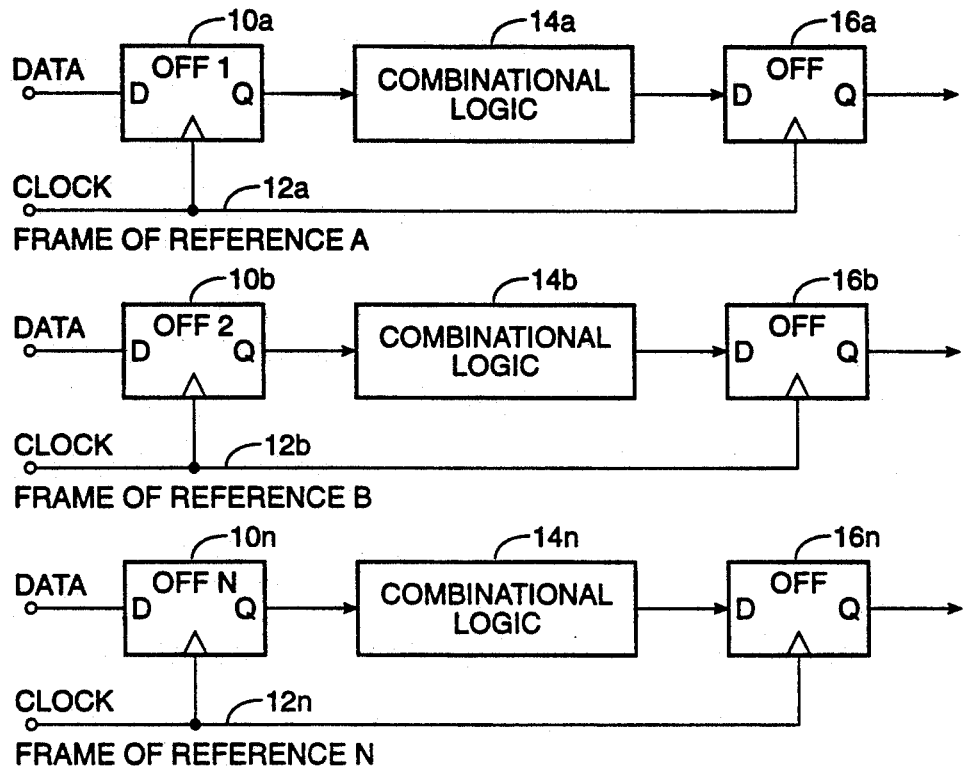
FIG. 1 is a schematic diagram of devices specified by a typical original user net list.

Referring to FIG. 1, the synchronizing system according to the present invention is applied to devices specified by a user's net list to provide a data-synchronized implemented circuit. A user net list is a text description of any digital sequential logic circuit. A user net list typically may specify a plurality of D type flip-flops 10a, 10b, . . . 10n. It is to be understood by those of ordinary skill in the art that each user flip-flop 10a, 10b, . . . 10n is representative of all such user flip-flops as may be used to configure various sequential logic in the user net list. For representative purposes, each user flip-flop 10a, 10b, . . . 10n is shown as a D type flip-flop having a data input D, a clock input for receiving a clock signal and a data output Q. Although those of ordinary skill in the art well recognize that the present invention may be used with other clocked elements.

Data is clocked into each user flip-flop in the user net list in accordance with well-known methods on the rising or falling edge of a clock signal generated by a user clock along a line 12a, 12b, . . . 12n leading to each flip-flop clock input. Each user flip-flop 10a, 10b, . . . 10n is also associated with a corresponding combinational logic unit 14a, 14b, . . . 14n. Data propagates through the combinational logic in accordance with conventional methods, and the output of each logic unit is clocked into corresponding flip-flop devices 16a, 16b, . . . 16n.

Figure 2:
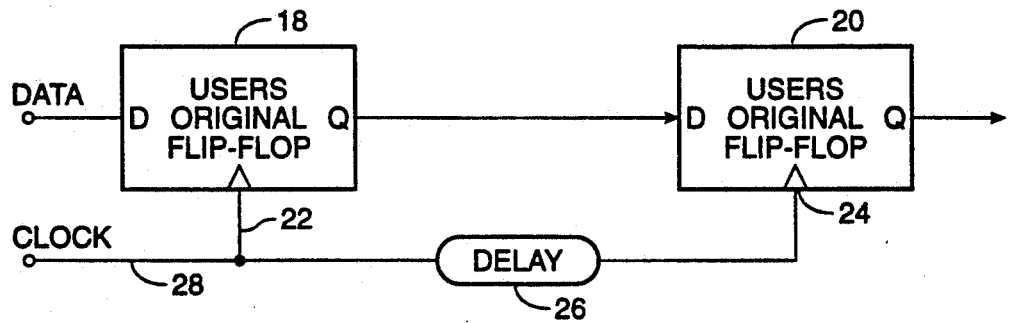
FIG. 2 is a diagram showing an unsynchronized logic circuit implemented directly from a user net list.

FIG. 2 shows an example of an unsynchronized logic circuit implemented directly from a user net list. Data must be present at the data input D of the user's original flip-flops 18 and 20 before the arrival of a clock signal over line 28 to the clock inputs 22 and 24 of the original flip-flops 18 and 20. The output Q of original flip-flop 18 is connected to the data input D of the original flip-flop 20. A delay element 26 is shown on the clock line 28 to illustrate the effect of skew in the clock line.

For proper operation, data must appear on data input D of flip-flop 18, the clock must then be present at clock input 22 of flip-flop 18. Data must be stable before and after the clock. New data resulting from a clock edge must not appear on any input pin before the same clock edge reaches all flip-flops. The data is then propagated through flip-flop 18 along the output Q to the input D of flip-flop 20. The clock signal at the clock input 24 of flip-flop 20 must arrive before the new data coming from flip-flop 18 in order to clock data correctly through flip-flop 20. It will be appreciated that due to skew on the clock lines, it is sometimes the case that data will arrive on the data input leads before the clock signal arrives resulting in incorrect circuit operation.

Figure 3:
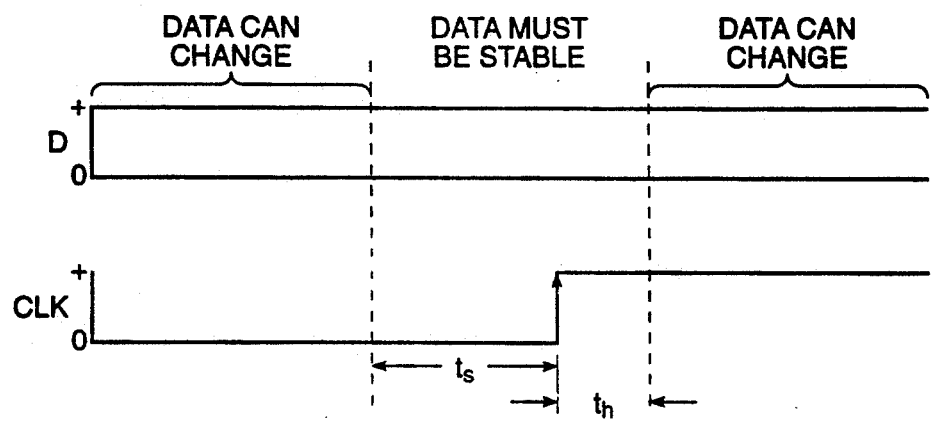
FIG. 3 is a timing diagram illustrating proper setup and hold times.

The timing diagram of FIG. 3 shows that in order for an implemented logic circuit to operate properly, data must be stable on the input D of a flip-flop device relative to the arrival of the clock pulse at the clock input for a specified period of time. As shown in FIG. 3, for any clocked device there is a specified "setup time" $t_s$ and also a specified "hold time" $t_h$. Input data must be present and stable from at least $t_s$ before the clock transition until a period equal to at least $t_h$ after the clock transition for proper operation. As an example, $t_s$ might be equal to 20 nanoseconds and $t_h$ equal to 5 nanoseconds. That is, the setup time requirement is met if the data input has been stable for at least 20 nanoseconds before the next clock rising edge.

Figure 4:
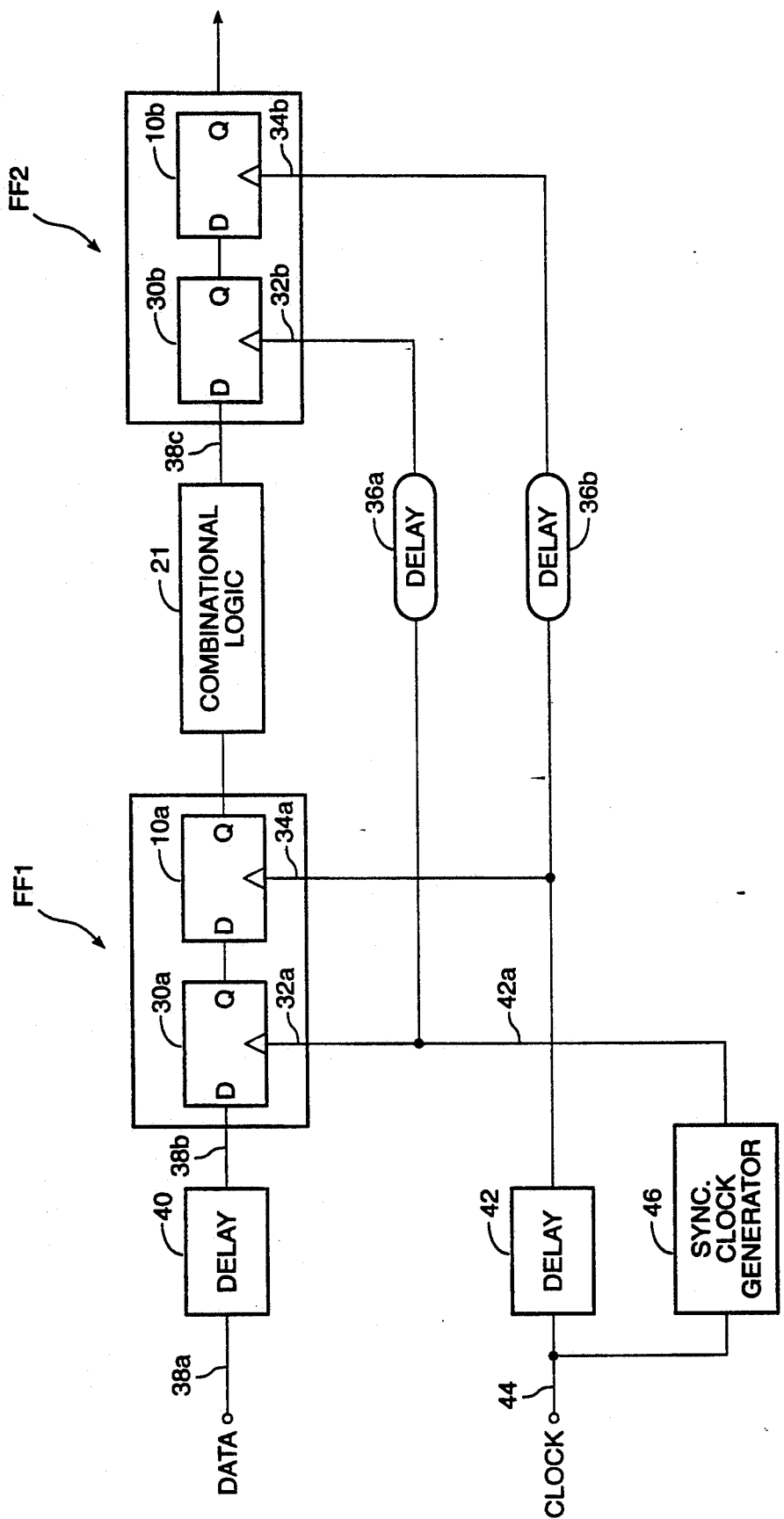
FIG. 4 is a schematic diagram of the synchronization process according to the present invention.

Referring now to FIG. 4, a preferred embodiment of the present invention is shown for automatic data synchronization of devices specified by the user net list. In accordance with the invention, a synchronizer flip-flop 30a, 30b is provided for each corresponding user original flip-flop 10a, 10b specified by the user net list. Each synchronizer flip-flop 30a, 30b is a "shadow" flip-flop which is provided upstream in the data path relative to each of the corresponding original user flip-flops 10a, 10b. Each synchronizer flip-flop 30a, 30b includes a data input D, a data output Q and a clock input 32a, 32b, respectively. Likewise, each original user flip-flop 10a, 10b has a data input D, a data output Q and a clock input 34a, 34b, respectively. Clock skew which inherently occurs in a practical realization of the design is schematically represented by delay elements 36a, 36b. FIG. 4 shows only two original user flip-flops 10a, 10b, and two synchronizer flip-flops 30a, 30b for the sake of simplicity. It will be appreciated that in an actual implementation according to the present invention, there is no limit to the number of flip-flop devices which may be synchronized.

In order to achieve the precise synchronization of data and clock signals necessary to successfully implement a user's net list, the synchronization method must insure that the synchronizer flip-flops 30a, 30b, receive and properly clock in data on their respective inputs along data lines 38b, 38c before the original flip-flops 10a, 10b receive data. This is done by adding a certain amount of delay in the external data line 38a. The means 40 for providing the delay may be a series of inverters or other known means for delaying a signal. The amount of delay is chosen by first determining the amount of skew in the user original net list. The amount of skew may be empirically determined in accordance with conventional techniques.

In addition, the clock signal to each synchronizer 30a, 30b must arrive at the respective clock input 32a, 32b of each synchronizer 30a, 30b before the user's clock arrives at the clock input of each user flip-flop 10a, 10b. Thus, a delay means 42 is provided in each clock line 44, in order to delay the arrival of the clock signal to the clock input 34a, 34b of the user's original flip-flop devices 10a, 10b. Delay means 42 may be any convenient means for delaying the arrival of the clock signal. In accordance with the invention, a simple synchronizing clock generator 46 is provided for deriving a synchronizing clock from each original user clock on the same frame of reference. The present synchronization method works for multiple nonoverlapping user clocks, that is, a plurality of user clocks on the same frame of reference. All that is needed is that multiple clocks on the same frame of reference be gated into an OR gate (not shown) which has multiple input leads and a single output lead before being applied to the synchronizing flip-flop. The output of the OR gate would provide the clock on line 42a as shown in FIG. 4. Thus, for each user clock on the same frame of reference, a simple synchronizing clock generator 46 may be provided which derives a synchronizing clock to be applied to the clock input leads 32a, 32b of a corresponding synchronizer flip-flops 30a, 30b.

If the user clocks independently overlap, a synchronizing clock is generated from each user clock. The individual synchronizing clocks are then gated together by an OR gate. Care must be taken that the edges do not occur too close together as this would cause the synchronizing clocks to overlap.

Figure 5:
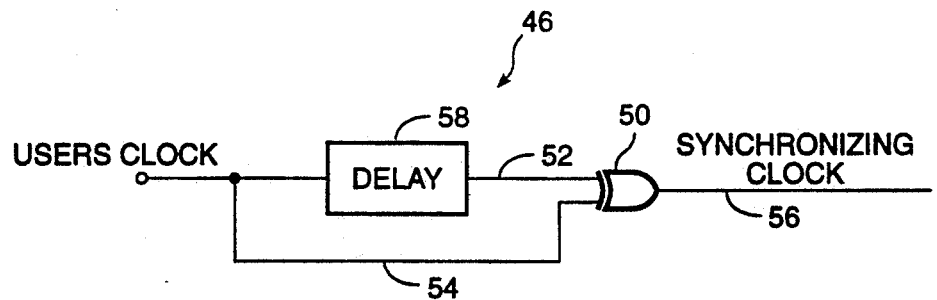
FIG. 5 is a schematic diagram of a simple synchronizing clock generator according to the present invention.

Referring now to FIG. 5, synchronizing clock generator 46 comprises an Exclusive OR gate 50 having a first input 52, a second input 54 and an output 56. Input 52 is connected to the user's clock through a delay means 58. Delay means 58 may be any suitable means such as a series of inverters for introducing delay into the clock signal. The second input 54 of the Exclusive OR gate 50 is connected directly to the user's clock signal. As shown in FIGS. 4 and 5, the synchronizing clock signal (the output of Exclusive OR gate 50) is applied through the output 56 of the Exclusive OR gate 50 in the synchronizing clock generator 46 to the clock inputs 32a, 32b of the synchronizers 30a, 30b.

Referring again to FIG. 4, the method according to the present invention provides an implemented circuit consisting of fully synchronized flip-flop devices FF1 and FF2. The implemented circuit is a fully synchronized version of the circuit specified by the user's original net list. The synchronizer flip-flops 30a, 30b and the user's original flip-flop devices 10a, 10b together comprise synchronized flip-flop devices FF1, FF2 which will allow the circuit to work correctly regardless of the inevitable and unpredictable clock skew provided that the delay elements 40, and 42 are chosen correctly.

Figure 6:
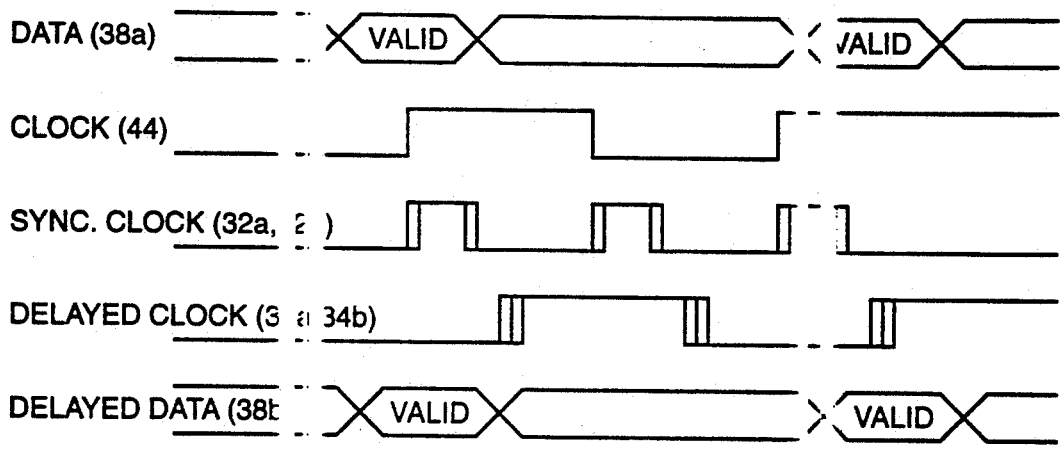
FIG. 6 is a timing diagram for the circuit of FIG. 4.

The sequential operation of the circuit shown in FIG. 4 may be understood by referring to the timing diagram in FIG. 6. The circuit operates correctly when the input data 38a is latched by the rising edge of the clock line 44 in the user's original flip-flop 10a. Data is saved in flip-flop 10a until the next rising clock edge when it is passed through combinatorial logic 21 and latched into the user's original flip-flop 10b. Without the synchronization flip-flops 30a, 30b, the inherent clock skew will move the rising edge of the clock signal at the clock inputs of some flip-flops, 10b for example, outside of the region where data on the input lead is valid.

In FIG. 6, the synchronizing clock at clock inputs 32a, 32b of synchronizer flip-flops 30a, 30b is generated from the clock signal 44. Skew between the clock or control inputs at different synchronizer flip-flops is indicated by double rising and falling lines in the timing diagram. Similarly, the delayed clock signal at the clock inputs 34a, 34b to the user's original flip-flops 10a, 10b is shown with multiple rising and falling lines to indicate the skew between different inputs.

The synchronized circuit operates as follows. First, the input data 38a is delayed to produce waveform 38b. It is then latched in synchronizer flip-flop 30a by the rising edge of the synchronizing clock signal. The delay element 40 must provide sufficient delay to ensure that the data is valid at the rising edge of the synchronizing clock despite delay and skew in the synchronizing clock signal. It may not be necessary in some implementations. Width of the synchronizing clock signal is not important as long as it is sufficient to meet the pulse-width requirements of flip-flops 30a, 30b. After the valid data is saved in synchronizer flip-flop 30a, it is transferred to the user's original flip-flop 10a and saved by the rising edge of the delayed clock signal 34a, 34b.

The clock signal must be delayed sufficiently to ensure that the time is provided from the rising edge of the synchronizing clock for data to propagate through synchronizer flip-flop 30a and be present at the input of flip-flop 10a despite skew in the synchronizing clock signal. Data then propagates through combinational logic 21 and is saved in synchronizer flip-flop 30b by the next synchronizing clock. The synchronizing clock signal is generated on both the rising and falling edge of the clock 44 in case some of the user's original flip-flops are falling edge triggered instead of rising edge triggered.

The present invention provides fully synchronized flip-flop devices FF1 and FF2 in the implemented circuit as shown in FIG. 4. The implemented circuit may thus be viewed as a synchronized implemented user net list. The synchronization method according to the present invention provides a method for automatically synchronizing a user net list without taking into account the amount of clock skew in the implemented circuit. Thus, the present invention provides a significant advantage over the prior art in that it produces a fully synchronized implemented circuit even in the presence of large amounts of clock skew which may exist in the circuit being implemented.

The present invention provides automatic data synchronization in an implemented circuit without violating hold time and setup constraints, even in the presence of clock skew. Formerly, the design would have to be laid out or implemented manually in a prototype configuration in order to determine the amount of clock skew in the lines. The clock skew would then be taken into account in determining the proper setup and hold times for the data lines so that the flip-flop devices could capture the proper data. The present invention has the advantage of enabling a user to implement a design from a user net list without the expense of having to first manually implement and test the design in order to eliminate hold time violations. It will be appreciated that the automatic method of data synchronization according to the present invention provides considerable time savings in comparison with prior art techniques for implementing a complete circuit design from a user net list.

The previously-described embodiment of the present invention is not applicable if the user's original net list contains transparent latches in addition to, or instead of edge triggered flip-flops. Circuits containing transparent latches often rely on the characteristic that data will be transferred through the latch as long as the control or clock input is active. If a synchronizer flip-flop is placed in front of a transparent latch, data will be transferred on the rising edge of the synchronizing clock signal and will be blocked at other times.

Figure 7:
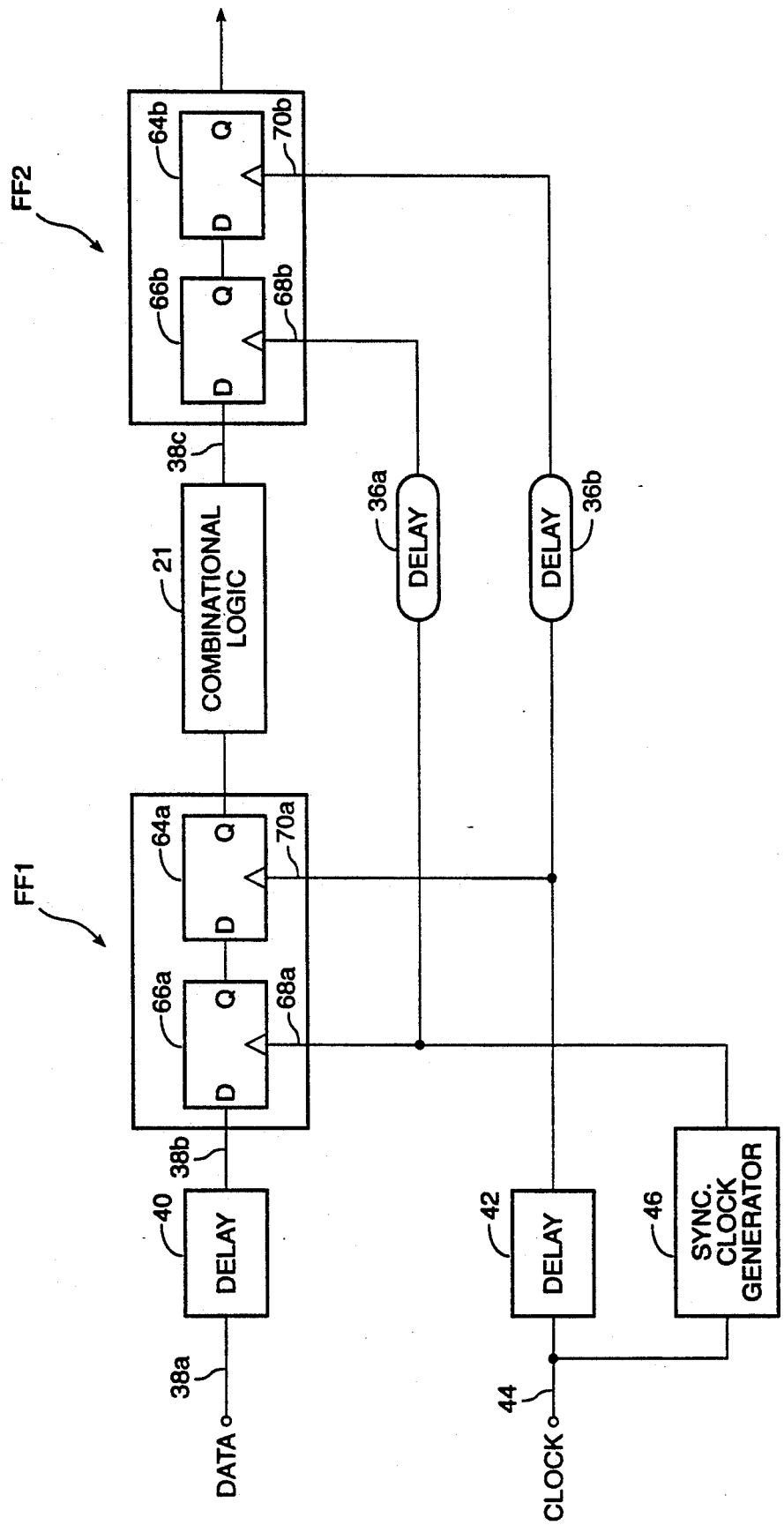
FIG. 7 is a schematic diagram of the process according to the present invention wherein the original net list contains latches instead of flip-flops.

An alternate embodiment of the present invention which may be used for circuits containing transparent latches is illustrated with reference to FIG. 7. FIG. 7 is the same as FIG. 4 except that the user's original flip-flop devices 10a, 10b and the synchronizing flip-flops 30a, 30b are replaced by transparent latches 64a, 64b and 66a, 66b, respectively. Thus, in FIG. 7 the synchronizer latches 66a, 66b have active low control inputs 68a, 68b so that they transfer data as long as the synchronizing clock from the synchronizing clock generator 46 is low and block data when the synchronizing clock is high. Alternatively, the synchronizing clock signal may be inverted and active high synchronizer latches used.

Figure 8:
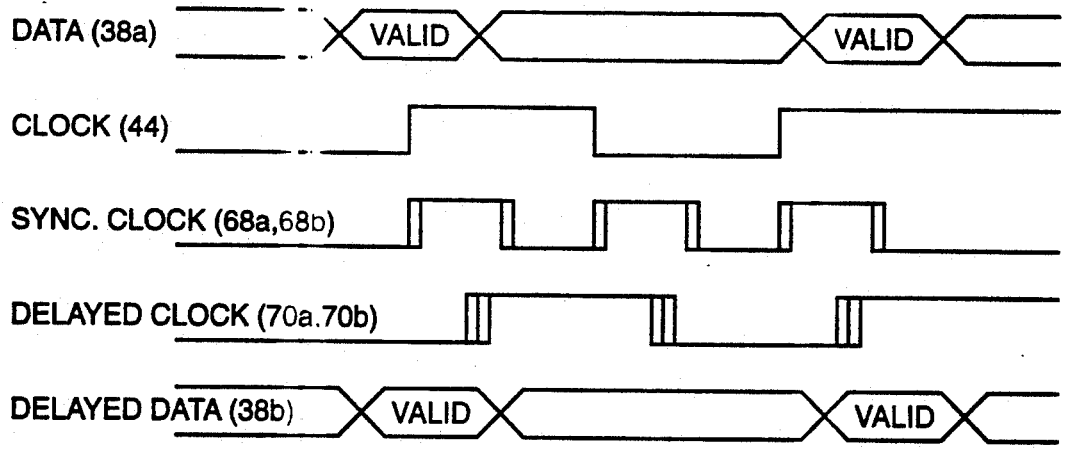
FIG. 8 is a timing diagram for the circuit of FIG. 7.

A timing diagram for the circuit of FIG. 7 is shown in FIG. 8. The synchronizing clock is generated by synchronizing clock generator 46 as previously explained, except that the pulse width must be controlled so that the falling edge of the synchronizing clock occurs after the rising or falling edge of the delayed clock for all sequential logic elements despite the clock skew illustrated by delay 20 in the clock line of FIG. 7. The operation of this circuit may be understood by thinking of the synchronizing clock as a blocking signal which prevents data from being transferred through the user's original latches during the skew period on the delayed clock signal. It is not desirable to make the width of the synchronizing clock too long as this will directly affect the maximum speed of operation of the synchronized circuit.

The width of the synchronizing clock is adjusted by first determining the amount of skew in the synchronizing clock net and in the user clock net. Then, the width of the synchronizing clock is set so the falling edge at the synchronizing latch occurs after the rising or falling edge of the user clock at the corresponding original user latch for all latches in the original user net list.

The synchronizing technique using transparent latches as synchronizing elements may be used if the user's original sequential devices were either edge-triggered flip-flops or transparent latches. The synchronizing technique using edge-triggered flip-flops as synchronizing elements may be used only if the user's original sequential devices were edge-triggered flip-flops. A design containing a mixture of transparent latches and edge triggered flip-flops may be synchronized using transparent latches as synchronizing elements or by using a mixture of transparent latches and edge-triggered flip-flops as synchronizing elements.

While the invention has been described in connection with what is presently considered to be the most practical and preferred embodiments, it is to be understood that the invention is not limited to the disclosed embodiment but, on the contrary is intended to cover various modifications and equivalent arrangements included within the spirit and scope of the appended claims.

We claim:

1. A method for preventing hold time violations in a sequential logic circuit being implemented from logic configuration data, said sequential logic circuit including a plurality of user clocked flip-flop devices, each of said user clocked flip-flop devices having a source data path associated therewith and being controlled from a corresponding clock signal, each of said user clocked flip-flop devices including a data input connected to a data signal input node for receiving data signals, a clock input for receiving said corresponding clock signal, and an output, said logic circuit characterized by an undetermined amount of clock skew between said plurality of user clocked flip-flop devices, said method comprising the steps of:

providing in said source data path associated with each of said user clocked flip-flop devices, a corresponding synchronizer flip-flop device having a data input connected to the data signal input node associated with its corresponding user clocked flip-flop device, an output connected to the data input of its corresponding user clocked flip-flop device, and a clock input;

driving each said synchronizer flip-flop device with a synchronizing clock signal derived from said corresponding clock signal associated with its corresponding user clocked flip-flop device; and, delaying each of said corresponding clock signals to form a plurality of delayed corresponding clock signals and applying said delayed corresponding clock signals to the clock inputs of each of said user clocked flip-flop devices.

2. The method of claim 1 wherein the step of delaying each of said corresponding clock signals includes the steps of first determining the amount of clock skew in the sequential logic circuit described by said logic configuration data and adding enough delay to each of said corresponding clock signals such that all of said synchronizing clock signals arrive at the clock inputs of each said synchronizer flip-flop device before any of said delayed corresponding clock signals arrive at the clock input of any user clocked flip-flop device.

3. A method for preventing hold time violations in a digital logic circuit being implemented from logic circuit configuration data, said digital logic circuit including a plurality of user clocked transparent latches having a source data path associated therewith and being controlled from a corresponding clock signal having a latching edge, each of said user clocked transparent latches having a data input for receiving data signals from a data signal input node, a clock input for receiving said corresponding clock signal and an output, said logic circuit characterized by an undetermined amount of clock skew between said plurality of user clocked transparent latches, said method comprising the steps of:

providing in said source data path associated with each of said user clocked transparent latches, a corresponding synchronizer clocked transparent latch having a data input connected to the data input signal node associated with its corresponding user clocked transparent latch, an output connected to the data input of its corresponding user clocked transparent latch, and a clock input;

driving each said synchronizer clocked transparent latch with a synchronizing clock signal derived from said corresponding clock signal associated with each user clocked transparent latch; and, delaying the latching edge of each of said corresponding clock signals to form a plurality of delayed latching edge corresponding clock signals and applying corresponding ones of said delayed latching edge corresponding clock signals to the clock inputs of each of said user clocked transparent latches.

4. The method of claim 3 wherein the step of delaying the latching edge of said corresponding clock signals includes the steps of first determining the amount of clock skew in the sequential logic circuit described by said logic configuration data and adding enough delay to the latching edge of each of said corresponding clock signals such that all of the latching edges of said synchronizing clock signals arrive at the clock inputs of each said synchronizer clocked transparent latch before any latching edge of any of said delayed latching edge corresponding clock signals arrive at the clock input of any user clocked transparent latch.

5. The method of claim 3 wherein the width of said synchronizing clock signal is adjusted by first determining the amount of clock skew in the sequential logic circuit described by said logic configuration data, then setting the width of said synchronizing clock signal such that its unlatching edge always occurs at the clock input of said synchronizer clocked transparent latch after the latching edge of said delayed latching edge corresponding clock signal arrives at the clock input of the corresponding user clocked transparent latch for all user clocked transparent latches in the sequential logic circuit described by said logic configuration data.

6. A method for preventing hold time violations in a sequential logic circuit being implemented from logic configuration data, said sequential logic circuit including a plurality of user clocked flip-flop devices, each of said user clocked flip-flop devices having a source data path associated therewith and being controlled from a corresponding clock signal, each of said user clocked flip-flop devices having a data input for receiving data signals from a data input signal node, a clock input for receiving said corresponding clock signal, and an output, said logic circuit characterized by an undetermined amount of clock skew between said plurality of user clocked flip-flop devices, said method comprising the steps of:

providing in said source data path associated with each of said user clocked flip-flop devices, a corresponding synchronizer clocked transparent latch device having a data input connected to the data input signal node associated with its corresponding user clocked flip-flop device, an output connected to the data input of its corresponding user clocked flip-flop device, and a clock input;

driving the clock input of each said synchronizer clocked transparent latch device with a synchronizing clock signal derived from said corresponding clock signal associated with its corresponding user clocked flip-flop device; and, delaying each of said corresponding clock signals to form a plurality of delayed corresponding clock signals and applying said delayed corresponding clock signals to the clock inputs of each of said user clocked flip-flop devices.

7. The method of claim 6 wherein the step of delaying said corresponding clock signals includes the steps of first determining the amount of clock skew in the sequential logic circuit described by said logic configuration data and adding enough delay to each of said corresponding clock signals such that all of the latching edges of said synchronizing clock signals arrive at the clock inputs of each said synchronizer clocked transparent latch before any delayed corresponding clock signals arrive at the clock input of any user clocked flip-flop device.

8. The method of claim 6 wherein the width of said synchronizing clock signal is adjusted by first determining the amount of clock skew in the sequential logic circuit described by said logic configuration data, then setting the width of said synchronizing clock signal such that its unlatching edge always occurs at the clock input of said synchronizer clocked transparent latch after the delayed corresponding clock signal arrives at the clock input of the corresponding user clocked flip-flop device for all user clocked flip-flop devices in the sequential logic circuit described by said logic configuration data.

* * * * *